United States Patent [19]

Meyer et al.

[11] Patent Number: 5,230,087

[45] Date of Patent: Jul. 20, 1993

[54] DEVICE FOR MEASURING VARIOUS CHARACTERISTICS OF A RADIO FREQUENCY SIGNAL

[75] Inventors: Arno M. Meyer, Malvern; Mark Grant, Newtown, both of Pa.

[73] Assignee: Belar Electronics Laboratory, Inc., Devon, Pa.

[21] Appl. No.: 581,555

[22] Filed: Sep. 12, 1990

[51] Int. Cl.[5] ............................................ H04B 17/00
[52] U.S. Cl. .................................. 455/67.1; 455/67.7; 455/115; 455/226.4
[58] Field of Search ................. 455/67, 115, 145, 226, 455/108, 67.1, 67.2, 67.4, 67.7, 226.1, 226.2, 226.4; 324/77 A

[56] References Cited

U.S. PATENT DOCUMENTS

| | | | |
|---|---|---|---|
| 2,272,768 | 2/1942 | Crosby | 179/171.5 |
| 2,297,752 | 10/1942 | DuMont et al. | 179/171.5 |
| 2,324,915 | 7/1943 | Dow | 250/17 |
| 2,329,625 | 9/1943 | Kentner | 250/17 |
| 3,245,005 | 4/1966 | Garfield | 332/20 |
| 3,930,200 | 2/1975 | Feld | 325/134 |
| 4,412,349 | 10/1983 | Wright | 455/67 |
| 4,414,632 | 11/1983 | Murrell | 455/115 |
| 5,025,208 | 6/1991 | Danzeisen | 324/77 R |

OTHER PUBLICATIONS

Schrock, Clifford B., "AM Broadcast Measurements Using Thespectrum Analyzer", Tektronik, Inc. 1976.
Burkhart, Dieter, et ál., "Modulation analyzer FAM for 55 KHz through 1.36 GHz", News from Rohde & Schwarz 89, vol. 20, 1980, pp. 4-7.
Article entitled "Techniques of Program Level Measurement Applicable to FM Stereo", by Bolgiano, published in vol. 11, No. 1 of Journal of the Audio Engineering Society, pp. 58-60 (Jan. 1963).

Primary Examiner—Reinhard J. Eisenzopf
Assistant Examiner—Chi Pham
Attorney, Agent, or Firm—Banner, Birch, McKie & Beckett

[57] ABSTRACT

A monitoring system which converts a desired radio frequency signal to an absolute value, detects the peak value of the signal, converts the peak value to a corresponding digital signal and processes the converted signal by a micro-computer to determine percent modulation of the signal and displays the result to the user. A plurality of signals may be monitored at the same time by multiplexing each signal onto a common signal line. The system my be remotely operated over an RS-232 line connected to a personal computer. The system also may be programmed with various alarm conditions such that when a monitored parameter falls outside of the desired range, the user is alerted to such condition.

30 Claims, 6 Drawing Sheets

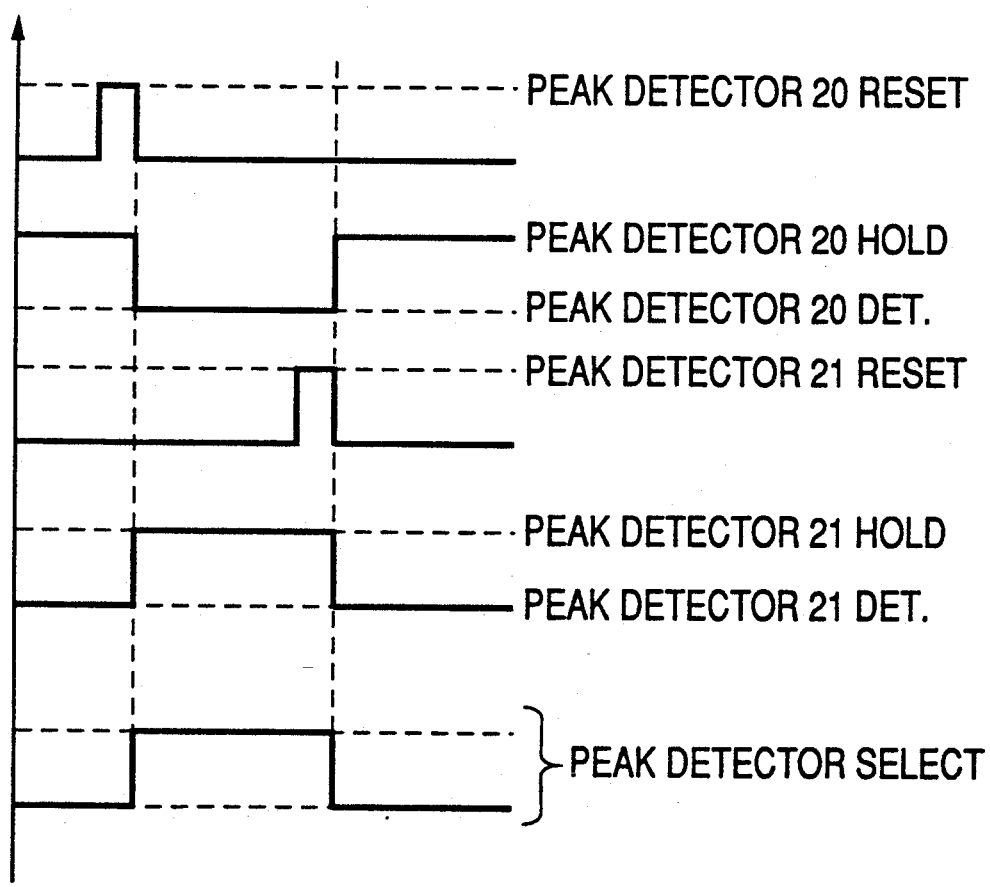

DEVICE FOR MEASURING VARIOUS CHARACTERISTICS OF A RADIO FREQUENCY SIGNAL

BACKGROUND OF THE INVENTION

The present invention generally relates to the field of radio frequency signal monitoring and measurement, and more particularly, is directed to a device for monitoring various parameters of a radio signal such as level of modulation.

From time to time, the FCC establishes requirements with respect to the percentage modulation of radio frequency transmitters. Current regulations require that transmitters in the maritime service generally have a peak modulation between 75 and 100 percent. In land based services, such as point-to-point microwave transmissions, peak modulation must be maintained between 70 and 100 percent.

With respect to AM, FM and TV signals used in domestic fix public services, the percentage of modulation must be maintained at as high a level as possible, consistent with good quality of transmission and good broadcast service. As a general rule, the modulation level should not be less than 85 percent on peaks of frequent recurrence. A lower modulation level is permitted when required to avoid objectional loudness or maintain the dynamic range of the program material. With respect to maximum modulation levels, AM stations may not exceed 100 percent modulation on negative peaks of frequent recurrence or 125 percent modulation on positive peaks of frequent recurrence. FM stations are limited to 100 percent modulation on peaks of frequent recurrence referenced to 75 KHz deviation. FM stations which provide subsidiary communication services using subcarriers concurrently with their normal program broadcast are permitted higher levels of modulation. Total peak modulation may be increased by 0.5 percent for each 1.0 percent subcarrier injection modulation to a maximum of 110 percent carrier modulation at 82.5 KHz peak deviation. The FCC regulations also require that with respect to stereo FM signals, the 19 KHz pilot signal must be transmitted at a level not in excess of 10 percent of full modulation and not to be less than 8 percent of full modulation. In the transmission of television signals, modulation of the aural carrier usually is limited to 100 percent of frequent recurrence.

Many stations, in an attempt to comply with the FCC regulations regarding modulation, resort to various compression or limiting amplifiers in an attempt to assure they do not exceed the modulation limits. Over modulation not only subjects the station to action by the FCC for violating its regulations, but may also cause crosstalk in an adjacent FM station. However, the use of such limiting devices may cause the percent modulation to be below the required minimum, which also could lead to FCC action as well as degrade the quality of the transmission. Moreover, for commercial reasons many stations wish to modulate their signals to the highest level permitted.

In many cases, even with the use of limited modulation to the transmitter, stations can be either consistently over or under modulating the carrier. To a large extent, this difficulty is due to the lack of a good dependable monitoring system capable of making available an instant, accurate means with which to check percentage modulation transmission of various components of the transmitted signal while maintaining regular station programming.

Prior art monitoring systems have frequently utilized meter indicators to give a visual indication of the amount of modulation of the carrier. The difficulty with such systems is that they require frequent calibration to correct for any change in the ballistic considerations of the meter. In addition, meter readings always are subject to some degree of interpretation and parallax.

SUMMARY OF THE INVENTION

Thus, it is the overall object of the present invention to provide a monitoring system for radio frequency signals which provides a constant, instant and accurate means to check selected components of the modulation of the transmitted signal.

A specific object of the present invention is to provide a transmission monitoring system which measures percent modulation of the transmitted signal and also provides both a visual and oral verification of the transmitted signal.

Another specific object of the present invention is to provide a transmission monitoring system wherein calibration can be checked and accomplished at any time without disrupting normal station operation.

A still further specific object of the present invention is to provide an accurate measurement of modulation components of a transmitted signal from a remote location.

Another specific object of the present invention is to provide a transmission monitoring system which does not require frequent calibration and when calibration is required can be easily accomplished.

It is a still further specific object of the present invention to provide a transmission monitoring system which is relatively inexpensive and is easy to operate.

It is another specific object of the present invention to provide a transmission monitoring system which can store a plurality of measurements for later recall.

The above and other objects of the present invention are achieved by a monitoring system which converts the desired radio frequency signal to an absolute value, detects the peak value of the signal, converts the peak value to a corresponding digital signal and processes the converted signal by a micro-computer to determine percent modulation and displays the result to the user. A plurality of signals may be monitored at the same time by multiplexing each signal onto a common signal line. The system my be remotely operated over an RS-232 line connected to a personal computer. The system also may be programmed with various alarm conditions such that when a monitored parameter falls outside of the desired range, the user is alerted to such condition.

BRIEF DESCRIPTION OF THE DRAWINGS

FIG. 5 is a timing diagram for various timing signals used to control the operation of the monitoring system shown in FIG. 2.

DETAILED DESCRIPTION OF THE PREFERRED EMBODIMENT

Figure 1:
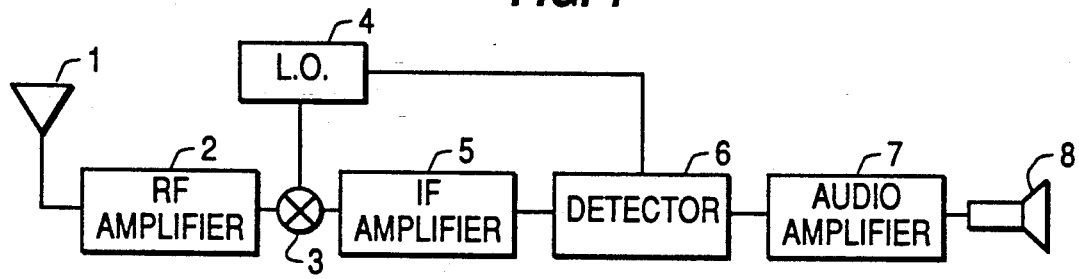
FIG. 1 is a block diagram illustrating a conventional FM radio receiver.

With reference to FIG. 1, a simplified diagram of an FM radio receiver is illustrated. The receiver includes an antenna 1 adapted to receive transmitted RF signals and apply them to an RF amplifier 2. The output of RF amplifier is applied to mixer circuit 3 along with a mixer signal from local oscillator 4. The amplified RF signal and local oscillator signals are mixed by mixer circuit 3 to provide an I.F. signal which is then amplified by intermediate frequency amplifier 5. The output from I.F. amplifier 5 is applied to detector 6 which detects the audio information modulated on the signal. Detector 6 also may include a bandpass filter for striping out the FM carrier pilot signal and subcarriers. The pilot signal is applied to local oscillator 4 for synchronizing the local oscillator to the received signal. The audio signal from detector 6 is amplified by audio amplifier 7 for reproduction on speaker 8. The block diagram in FIG. 1 illustrates a typical radio receiver as known in the prior art. The receiver may also include other stages such as a second mixer and I.F. amplifier, multiplex decoder and various tuning and band switching controls.

Figure 2:
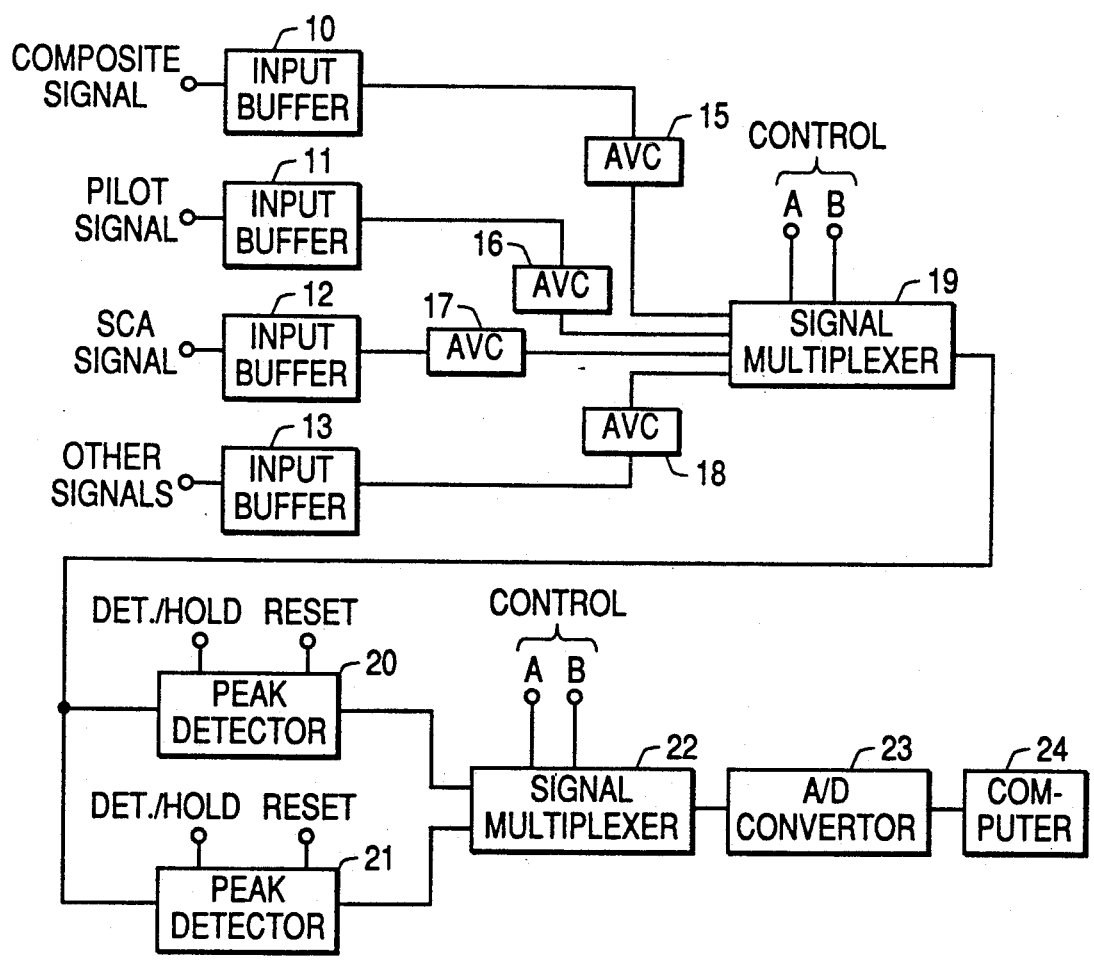
FIG. 2 is a block diagram of the monitoring system of Applicants' invention.

FIG. 2 is a block diagram illustrating one embodiment of a radio frequency monitoring system in accordance with the present invention. The system includes input buffers 10, 11, 12, and 13. Input buffer 10 receives a radio frequency composite signal in the form of an I.F. signal taken, for example, from I.F. amplifier 5 shown in FIG. 1. Input buffer 11 receives the pilot signal taken from the output of the bandpass filter in detector 6 shown in FIG. 1. Input buffer 12 receives SCA (subsidiary communication authority) signals from the receiver shown in FIG. 1. Input buffer 13 may receive any one of various other signals which the users desires to monitor, including a calibration signal for the system.

Figure 3:
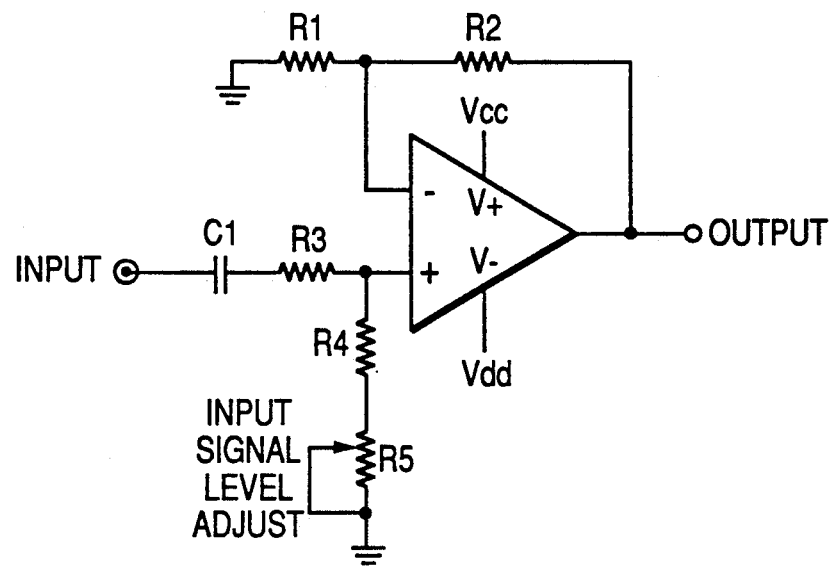
FIG. 3 is schematic diagram illustrating the input buffer circuit shown in FIG. 2.

The purpose of input buffers 10, 11, 12 and 13 are to buffer and scale the composite, pilot, SCA and other signals, respectively, to predetermined values as required for further processing. Each input buffer may take the form of a conventional differential amplifier with means to adjust the level of the input signal. An example of such an amplifier is part No. 34081 made, for example, by Motorola. An example of a signal processing circuit using the 34081 differential amplifier is shown in FIG. 3 where C1 and R3 form a coupling network for coupling the input signal to the non-inverting input to the amplifier, R4 and R5 form an input level adjustment circuit for setting the desired level of input signal and resistor R1 and R2 form a feedback network from the output of the amplifier to the inverting input. Though in FIG. 3, the output level adjustment circuit is shown connected to the non-inverting input, it may be connected to the inverting input, e.g., in series between the grounded end of resistor R1 and ground.

The outputs of input buffers 10, 11, 12 and 13 are connected to respective inputs of absolute value circuits 15, 16, 17 and 18. The purpose of the absolute value circuits is to convert the signals to an absolute value. The absolute value circuits may be formed of one or more differential amplifiers as is known in the prior art. The output of each of the absolute value circuits is connected to signal multiplex 19. The purpose of multiplex 19 is to select between the signals at input buffers 10, 11, 12 and 13 in accordance with control signals A and B and to output the selected signal to peak detectors 20 and 21. Multiplex 19 may be formed of part No. CD4051B made, for example, by RCA.

The purpose of peak detectors 20 and 21 is to track the input signal until a maximum value is reached. A peak value signal is then provided at the output. The peak detectors include a detector/hold logic input signal. At one logic level, the detectors track the input signal for its maximum or peak value, at the other logic level, the detectors hold the peak value. The detectors also include a reset input for resetting the detectors to a predetermined state. Detectors 20 and 21 may be formed of part No. PKD-01 made, for example, by Precision Monolithics, Inc.

The output of peak detectors 20 and 21 are provided to respective inputs of signal multiplexer 22. The purpose of multiplexer 22 is to select between the signals from peak detectors 20 and 21 in accordance with control signals A and B and to output the selected signal to A/D convertor 23. Multiplexer 22 may be formed of part No. CD4051B made, for example, by RCA.

The multiplexed signal from multiplexer 22 is converted to a multi-bit digital signal by A/D converter 23. A/D convertor 23 may be formed of part No. AD7578 made by various companies. The multi-bit digital signal is provided to micro-computer 24. Micro-computer 24 may be formed of part No. MC68HCE1FN made by Motorola and may include internal RAM, ROM and EPROM memory and associated registers for storing data and computer program code. RAM, ROM and EPROM memory may also be external to micro-computer 24 as is well known in the art. Micro-computer 24 also includes I/O ports for receiving/sending data and control signals. The multi-bit digital signal connected to such a port.

Figure 4:
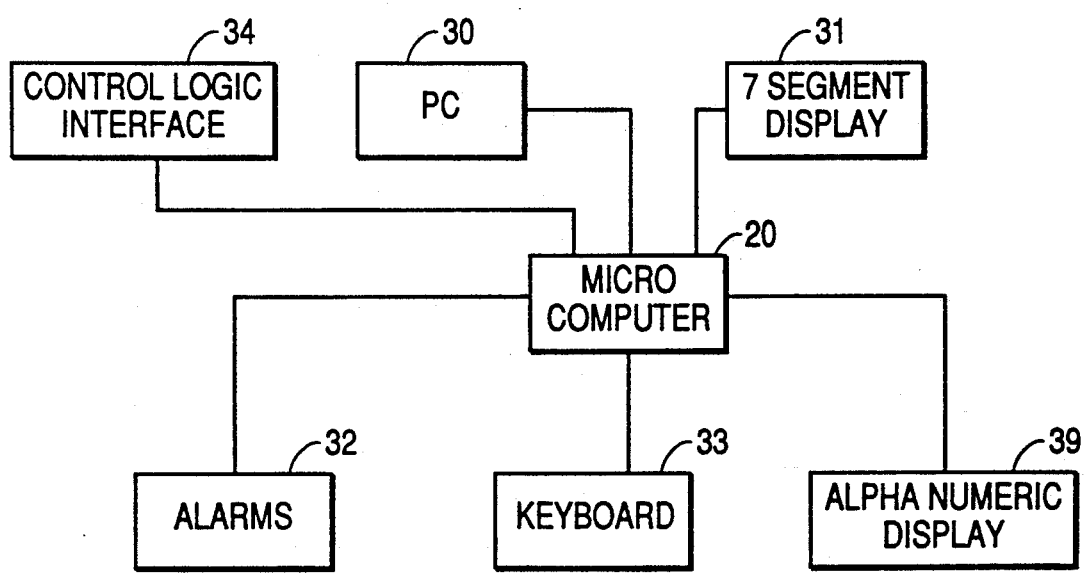
FIG. 4 is a block diagram illustrating the micro-computer shown in FIG. 3 and the attached peripherals.
Figure 6A:
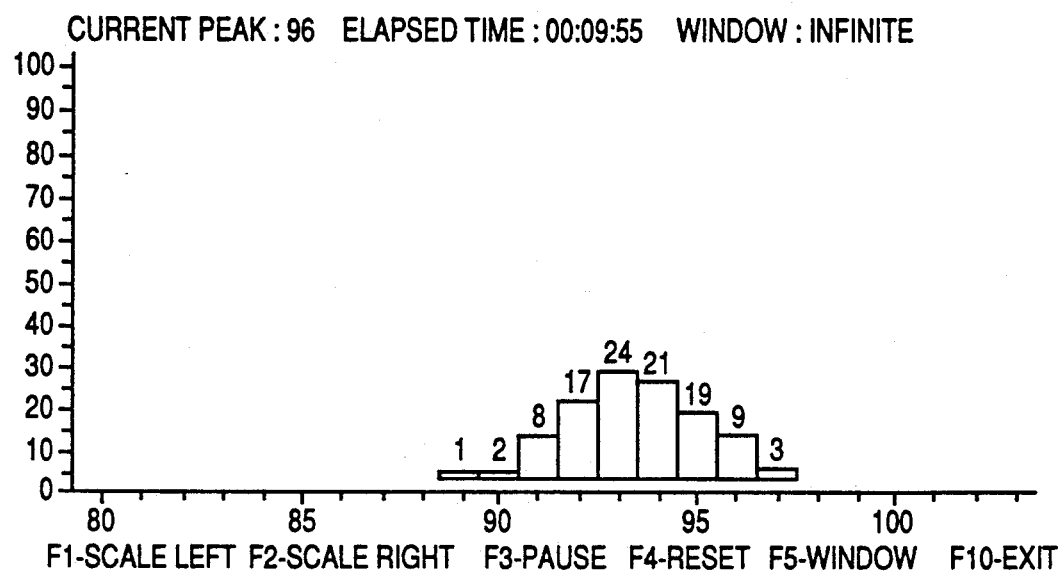
FIG. 6 are examples of modulation histograms produced by the monitoring system of the Applicants' invention.
Figure 6B:
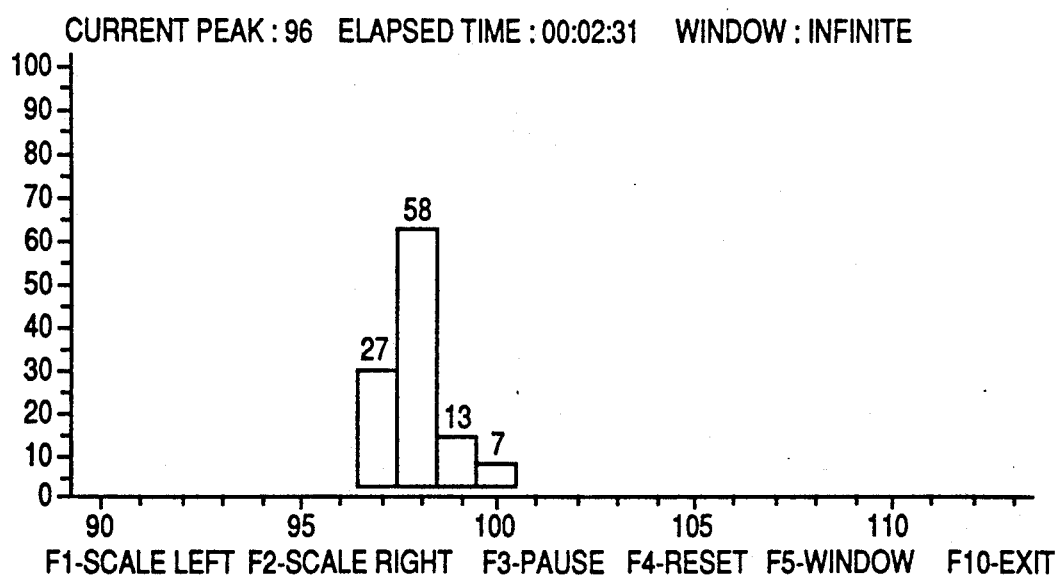
Figure 6C:
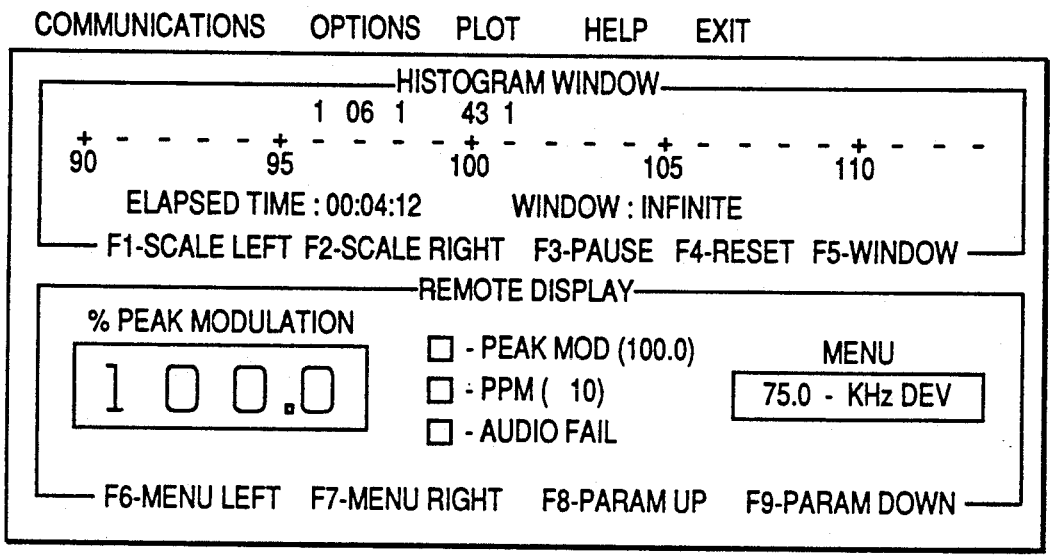
Figure 6D:
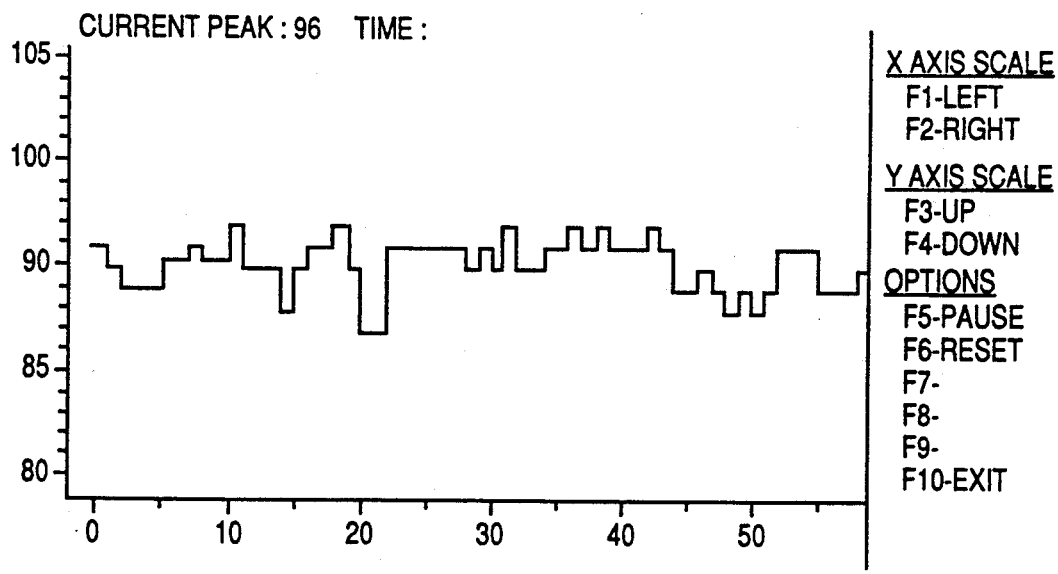

Computer 24 controls the operation of the monitoring system in accordance with Applicants' invention. FIG. 4 is a block diagram illustrating the peripheral devices connected to micro-computer 24. As shown in FIG. 4, control logic interface 34 is connected to micro-computer 24 and is used for providing control signals A and B to signal multiplexers 19 and 22 and the detect-/hold and reset signals to peak detectors 20 and 21 as indicated by the timing diagram shown in FIG. 5. Control logic interface 34 provides the proper control signal levels and buffering needed by the multiplexers and peak detectors.

A multi-digit 7-segment display 31 also is connected to micro-computer 24 and is used as a visual display for the monitored modulation level output by the computer to the user. Display 31 includes appropriate display decoders and drivers as is known in the prior art.

Alphanumeric display 34 similarly is connected to micro-computer 24 and is used as a visual display for information output by the computer to the user. The monitoring system of Applicants' invention is menu-driven and during operation, micro-computer 24 outputs various menu screens for display to the user on display 34. The user may then make the appropriate menu selection for operating the system. Display 34 also is used to display alarm condition information to the user.

Keyboard 33 is connected to micro-computer 24 and provides a means for the user to input data and instruction commands to the computer. Keyboard 33 may take the form of a full alphanumeric keyboard or amount to a plurality of function keys for manipulating the menu-screen displayed on display 34 and making the desired menu selection.

Alarm 32 is connected to micro-computer 24 and provides an indication of an alarm condition. The alarm informs the user when a particular parameter is outside of a predetermined range. The alarm may take the form of a lighted LED or audio warning device. When an alarm condition exist, alarm 32 alerts the user while at the same time micro-computer 24 informs the user of the condition which triggered the alarm by writing an appropriate message to alphanumeric display 34. Alarm 32 stays on and the alarm message stays in display 34 for as long as the alarm condition exist. If a further alarm condition is created which is related to a different parameter during the pendency of the present alarm, micro-computer 24 informs the user of the nature of the second alarm via an appropriate message on display 34 and cycles between messages related to each alarm at a predetermined interval the while alarm conditions exist.

A personal computer 30 also is connected to micro-computer by an RS-232 line. Personal computer 30 provides remote operation of the monitoring system.

The monitoring system of the present invention a history of modulation levels to be stored for later recall in the form of a histogram which may be displayed by PC 30. FIG. 6 are examples of such histograms. In addition, the modulation level at the transmitter site may be controlled through the monitoring system via PC 30. In summary, the monitoring system of Applicants' invention includes the following features:

Menu driven,
Modulation deviation in 0.1 KHz increments,
Self calibrating to an external calibration signal,
Pre-set peak modulation,
Pre-set PPM,
Variable peak hold time
Real time mode or past time mode of operation,
Silent sentry alarm, adjustable in time and threshold,
Alarms read on menu,
Modulation adjustment via PC, and
Password protection.

Figure 7:
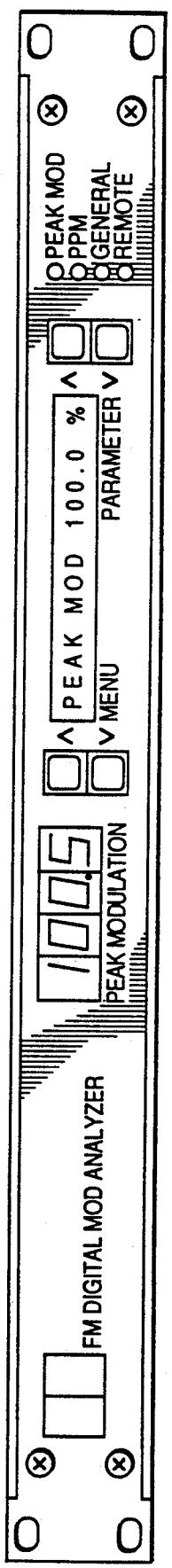
FIG. 7 is an illustration of the one embodiment of the control panel for the monitoring system of applicants' invention.

FIG. 7 illustrates one embodiment of the control panel for the monitoring system of the Applicants' invention.

While the present invention has been illustrated and described in detail in the drawings and foregoing description, it will be recognized that changes and modifications can and will occur to those skilled in the art. It is therefore intended by the appending claims, to cover any such changes and modifications as fall within the true spirit and scope of the invention.

We claim:

1. A device for measuring a selected characteristic of a radio frequency signal, said device comprising:
    receiver means for receiving said selected characteristic;
    absolute value means coupled to said receiver means for converting said selected characteristic to a corresponding absolute value signal;
    peak detector means coupled to said absolute value means for receiving said absolute value signal and detecting when said absolute value signal is at a peak level, said peak detector means providing a corresponding output of said absolute value signal when said absolute value signal is at said peak level; and
    processing means for processing said absolute value signal output by said peak detector means to provide a continuous, timed measure of said selected characteristic over time, said processing means incorporating the ability to retain successive peak values of said selected characteristic.

2. A device according to claim 1 further comprising display means for visually displaying said measure of said selected characteristic.

3. A device according to claim 2 further comprising interface means coupled between said receiver means and said absolute value means for interfacing said selected characteristic to said absolute value means.

4. A device according to claim 3 wherein said interface means include scaling means for scaling the amplitude of said selected characteristic to within a predetermined range, the scaled amplitude of said selected characteristic being supplied to said absolute value means.

5. A device according to claim 4 wherein said interface means is formed of at least one differential amplifier, said differential amplifier being used for scaling the amplitude of said selected characteristic.

6. A device according to claim 2 wherein said absolute value signal is in analog form, said device further including analog to digital conversion means for converting said absolute value signal to a digital form for processing by said processing means.

7. A device according to claim 6 wherein said absolute value means is formed of at least one differential amplifier.

8. A device according to claim 2 wherein said processing means includes a microprocessor.

9. A device according to claim 8 wherein said processing means further includes memory means for storing a computer program for execution by said microprocessor, said microprocessor controlling the operation of said device in accordance with said computer program.

10. A device according to claim 9 wherein said processing means further includes alarm means with user adjustable alarm levels for controlling an alarm device for indicating to the user an alarm condition associated with said selected characteristic.

11. A device according to claim 10 wherein said alarm means is triggered to indicate said alarm condition when the level of said absolute value signal exceeds a predetermined level.

12. A device according to claim 10 wherein said alarm means is triggered to indicate said alarm condition when the level of said absolute value signal is below a predetermined level.

13. A device according to claim 11 wherein said alarm device provides a visual indication of said alarm condition to the user.

14. A device according to claim 11 wherein said alarm device provides an audible indication of said alarm conditions to the user.

15. A device according to claim 12 wherein said alarm device provides a visual indication of said alarm condition to the user.

16. A device according to claim 12 wherein said alarm device provides an audible indication of said alarm condition to the user.

17. A device according to claim 10 wherein said device further includes display means for displaying a message to the user indicating the nature of said alarm condition.

18. A device according to claim 1 wherein said device further includes input means for the user to control the operation of said device.

19. A device according to claim 1 wherein said device further includes input means for receiving input commands from the user and display means for displaying menu selection information from said processing means, said menu selection information being used by the user to provide commands to said input means for controlling the operation of said device.

20. A device according to claim 1 wherein said processing means includes remote interface means for interfacing said device to a remote monitoring device which can control at least some operations of said device.

21. A device for measuring selected charactertics of a radio frequency signal, said device comprising:
receiver means for receiving said selected characteristics;
an input channel for each of said selected characteristics, wherein each of said input channels includes
  interface means coupled to said receiver means for scaling the amplitude of the associated characteristic to within a predetermined range,
  absolute value means coupled to said interface means for converting the scaled associated characteristic to a corresponding absolute value signal;
multiplexer means for multiplexing said absolute value signals from each of said channels to a common line;
peak detector means coupled to said common line for receiving each of said absolute value signals and detecting when said absolute value signals are at a peak level, said peak detector means providing a corresponding output of said absolute value signals when said absolute value signals are at said peak level; and
processing means for processing said absolute value signals output by said peak detector means to provide a continuous, timed measure of each of said selected characteristics over time, said processing means incorporating the ability to retain successive peak values of said selected characteristic.

22. A device according to claim 21 further comprising display means for visually displaying said measure of each of said selected characteristics.

23. A device according to claim 21 wherein said interface means is formed of at least one differential amplifier, said differential amplifier being used for scaling the amplitude of said associated characteristic.

24. A device according to claim 23 wherein each of said absolute value signals are in analog form, said device further including analog to digital conversion means for converting said absolute value signals to a digital form for processing by said processing means.

25. A device according to claim 21 wherein said processing means further includes a microprocessor and memory means for storing a computer program for execution by said microprocessor, said microprocessor controlling the operation of said device in accordance with said computer program.

26. A device according to claim 25 wherein said processing means further includes alarm means for controlling an alarm device for indicating to the user an alarm condition associated with said selected charateristics, said alarm means being triggered to indicate said alarm condition when the levels of said absolute value signals are outside of a predetermined range.

27. A device according to claim 26 wherein said alarm device provides a visual indication of said the alarm condition to the user.

28. A device according to claim 26 wherein said alarm device provides an audible indication of said alarm condition to the user.

29. A device according to claim 26 wherein said device further includes display means for displaying a message to the user indicating the nature of said alarm condition.

30. A device according to claim 21 wherein said device further includes input means for receiving input commands from the user and display means for displaying menu selection information from said processing means, said mean selection information being used by the user to provide commands to said input means for controlling the operation of said device.

* * * * *